(12) United States Patent
Entner

(10) Patent No.: US 10,032,106 B2
(45) Date of Patent: Jul. 24, 2018

(54) TEMPERATURE-COMPENSATED OSCILLATOR

(71) Applicant: NXP B.V., Eindhoven (NL)

(72) Inventor: Robert Entner, Gratkorn (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/418,719

(22) Filed: Jan. 28, 2017

(65) Prior Publication Data

US 2017/0220918 A1  Aug. 3, 2017

(30) Foreign Application Priority Data

Jan. 28, 2016  (EP) ..................................... 16153092

(51) Int. Cl.
  *G06K 19/06*   (2006.01)
  *G06K 19/077*  (2006.01)
  *H03L 1/04*    (2006.01)

(52) U.S. Cl.
  CPC ............ *G06K 19/0772* (2013.01); *H03L 1/04* (2013.01)

(58) Field of Classification Search
  CPC ............ G06K 19/07749; G07F 7/1008; G06Q 20/341
  USPC ......................................................... 235/492
  See application file for complete search history.

(56) References Cited

U.S. PATENT DOCUMENTS

| | | | | |
|---|---|---|---|---|
| 3,978,431 | A | * | 8/1976 | Lattin ...................... H03B 5/04 257/300 |
| 5,668,506 | A | * | 9/1997 | Watanabe ............... H03L 1/025 310/315 |
| 5,764,111 | A | * | 6/1998 | Bushman ............. H03K 3/0315 331/57 |

(Continued)

OTHER PUBLICATIONS

Extended European Search Report for Patent Appln. No. 16153092.8 (dated Jul. 27, 2016).

*Primary Examiner* — Ahshik Kim

(57) ABSTRACT

The disclosure relates to a temperature-controlled oscillator. Embodiments disclosed include a temperature-compensated oscillator (100) comprising: a first capacitive charging circuit (101) connected between a supply voltage connection (104) and a common connection (105), comprising a first transistor (106) and a first capacitor (107), the first transistor (106) arranged to switch states when the first capacitor (107) is charged above a threshold voltage of the first transistor (106); a second capacitive charging circuit (102) connected between the supply voltage connection (104) and the common connection (105), comprising a second transistor (109) and a second capacitor (110) arranged to begin discharging when the first transistor (106) switches states, the second transistor (109) arranged to switch states when the second capacitor (110) is discharged below a voltage equal to a supply voltage (VDD) at the supply voltage connection (104) minus a threshold voltage of the second transistor (109); and a third capacitive charging circuit (103) connected between the supply voltage connection (104) and the (Continued)

common connection (105), comprising a third transistor (111) and a third capacitor (112) arranged to begin discharging when the second transistor (109) switches states, the third transistor (111) arranged to switch states when the third capacitor (112) discharges below a threshold voltage of the third transistor (111).

10 Claims, 2 Drawing Sheets

(56) References Cited

U.S. PATENT DOCUMENTS

| | | |
|---|---|---|
| 5,898,345 A * | 4/1999 | Namura ................ H03B 5/368 |
| | | 331/158 |
| 7,581,881 B2 | 9/2009 | Kim et al. |
| 2004/0217821 A1 | 11/2004 | Ho |
| 2009/0115542 A1 * | 5/2009 | Nakamura .............. H03B 5/04 |
| | | 331/176 |
| 2009/0160562 A1 | 6/2009 | Huang |
| 2010/0066434 A1 | 3/2010 | Liao et al. |
| 2011/0175684 A1 | 7/2011 | Liu |

\* cited by examiner

TEMPERATURE-COMPENSATED OSCILLATOR

CROSS-REFERENCE TO RELATED APPLICATIONS

This application claims the priority under 35 U.S.C. § 119 of European patent application no. 16153092.8, filed on Jan. 28, 2016, the contents of which are incorporated by reference herein.

FIELD

The disclosure relates to a temperature-controlled oscillator.

BACKGROUND

The characteristics of semiconductor components, such as the threshold voltage of a transistor, will tend to vary with temperature. To maintain operation of circuits such as oscillators within a desired frequency range over an expected operating temperature range will therefore generally require some kind of temperature compensation. In conventional oscillators this may be achieved for example by stacking (i.e. placing in series) components having opposing temperature dependent threshold voltages, with one affecting the oscillation frequency proportional to absolute temperature (PTAT) and the other affecting the frequency complementary to absolute temperature (CTAT). Doing so, however, inevitably results in a minimum supply voltage of two threshold voltages plus any overhead of one or two overdrive voltages being necessary. In applications where a sufficient voltage is available this may not be a problem. However, in applications where a voltage supply is limited, for example in RFID tags, this can result in the oscillator requiring more power than is available or limiting the range of operation.

SUMMARY

In accordance with a first aspect there is provided a temperature-compensated oscillator comprising:

a first capacitive charging circuit connected between a supply voltage connection and a common connection, comprising a first transistor and a first capacitor, the first transistor arranged to switch states when the first capacitor is charged above a threshold voltage of the first transistor;

a second capacitive charging circuit connected between the supply voltage connection and the common connection, comprising a second transistor and a second capacitor arranged to begin discharging when the first transistor switches states, the second transistor arranged to switch states when the second capacitor is charged above a voltage equal to a supply voltage at the supply voltage connection minus a threshold voltage of the second transistor; and a third capacitive charging circuit connected between the supply voltage connection and the common connection, comprising a third transistor and a third capacitor arranged to begin discharging when the second transistor switches states, the third transistor arranged to switch states when the third capacitor discharges below a threshold voltage of the third transistor.

By arranging the charging circuits such that each circuit is triggered by a preceding charging circuit, the need to stack opposing temperature coefficient thresholds is avoided, thereby enabling a lower supply voltage. Instead of temperature compensation resulting from addition of voltage thresholds, as in conventional temperature-compensated oscillators, temperature compensation is achieved by varying the charging time of each of the charging circuits depending on the threshold voltages of each transistor. This results in the need for a supply voltage that is only one threshold voltage plus an overdrive voltage and a further overdrive voltage sufficient for a current source.

The temperature-compensated oscillator may further comprise:

a first current source connected between the supply voltage connection and the first capacitor;

a second current source connected between the supply voltage connection and the second capacitor; and a third current source connected between the third transistor and the common connection.

The current sources provide current to or from each of the capacitors in the charging circuits, the charge on which triggers a subsequent charging circuit.

The first, second and third transistors may be field effect transistors, for example MOSFET transistors.

First, second and third nodes may be defined in the oscillator, such that the first node connects the first capacitor with a gate connection of the first transistor and a drain connection of the third transistor, the second node connects a drain connection of the first transistor with the second capacitor and a gate connection of the third transistor and the third node connects the third capacitor with a drain connection of the second transistor and a gate connection of the third transistor.

Source connections of the first and third transistors may be connected to the common connection and the source connection of the second transistor connected to the supply voltage connection. This arrangement enables the second charging circuit to have a coefficient that is complementary to absolute temperature.

The first and third transistors may be n-channel MOSFETs and the second transistor a p-channel MOSFET.

The temperature-compensated oscillator may further comprise a clock signal output module having a D-type flip-flop with an input connected to the third node.

The temperature-compensated oscillator may be incorporated into an integrated circuit for an RFID tag, which may itself be incorporated into an RFID tag.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
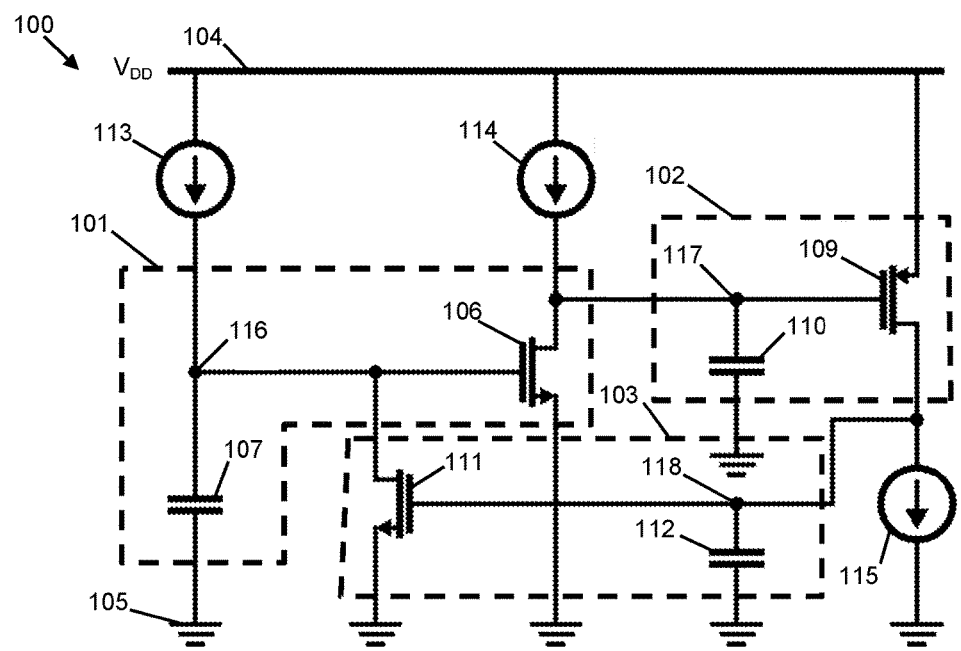
FIG. 1 is a schematic circuit diagram of an example embodiment of an oscillator.

It should be noted that the Figures are diagrammatic and not necessarily drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 is a schematic circuit diagram of an example embodiment of an oscillator 100. The oscillator 100 comprises first, second and third charging circuits 101, 102, 103, which are arranged such that each charging circuit is triggered by a preceding charging circuit. Charging of the first charging circuit 101 triggers a change in charging of the second charging circuit 102, which triggers a change in charging of the third charging circuit 103, which then triggers a change in charging of the first charging circuit 101, thereby creating an oscillatory response to a voltage supply $V_{DD}$ provided on a voltage supply connection 104.

Figure 2:
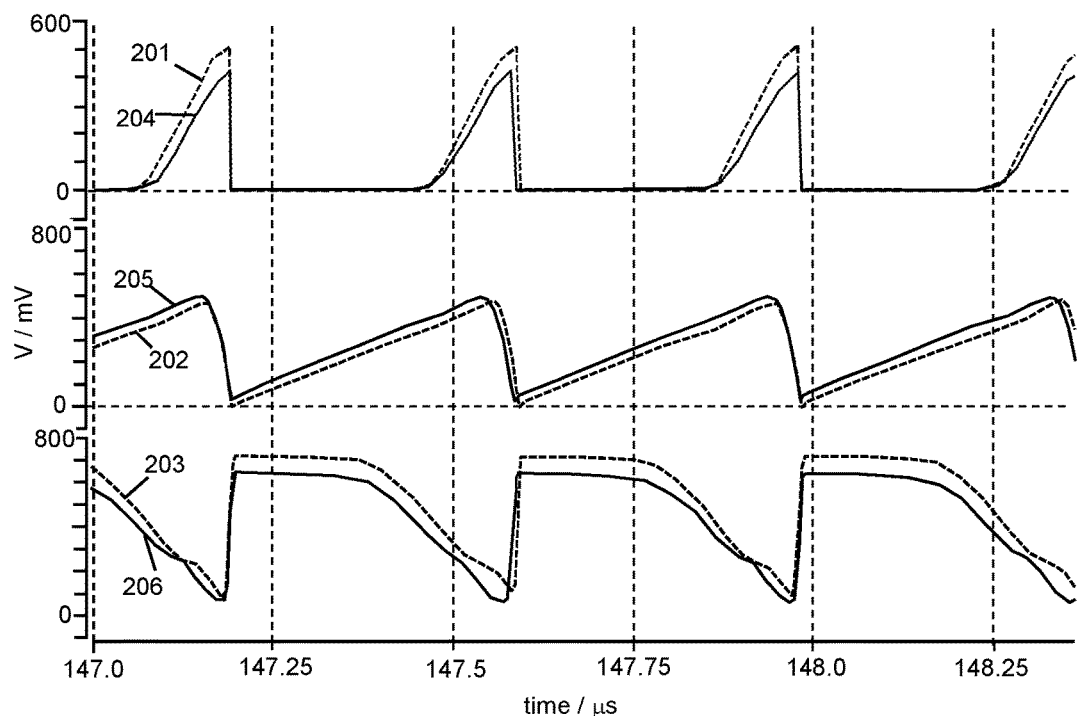
FIG. 2 is a series of plots of voltage as a function of time for various nodes of the oscillator of FIG. 1 at different temperatures.

FIG. 2 is a series of plots showing voltage as a function of time for first, second and third nodes 116, 117, 118 in the circuit 100 of FIG. 1. Voltage traces 201, 202, 203 are for the first, second and third nodes 116, 117, 118 respectively at a low temperature, while voltage traces 204, 205, 206 are for the first, second and third nodes 116, 117, 118 respectively at a high temperature.

Each charging circuit 101, 102, 103 comprises a transistor 106, 109, 111 and a capacitor 107, 110, 112. Each capacitor 107, 110, 112 is charged or discharged by an associated current source 113, 114, 115. The first capacitor 107 is connected between the first current source 113 and the common connection 105 (which may alternatively be termed a ground connection in some embodiments), and is charged by current flow through the first current source 113. The second capacitor 110 is connected between the second current source 114 and the common connection 105, and is arranged to be charged by current flow through the second current source 114. The third capacitor 112 is connected between the common connection 105 and the third current source 115, which is arranged to discharge the third capacitor 112 when the second transistor 109 is not conducting.

Each transistor 106, 109, 111 is arranged to change states, i.e. to switch on or off, depending on the charge state of (i.e. the voltage across) an associated capacitor 107, 110, 112. The first transistor 106, which in the illustrated embodiment is an n-channel MOSFET, switches on, i.e. conducts, if the voltage at the first node 116, which is equal to the voltage across the first capacitor 107, is above its threshold voltage. The second transistor 109, which in the illustrated embodiment is a p-channel MOSFET, switches off, i.e. does not conduct, if the voltage at the second node 117, which is equal to the voltage across the second capacitor 110, is above a voltage equal to the supply voltage $V_{DD}$ minus the threshold voltage of the second transistor 109. The third transistor 111, which in the illustrated embodiment is an n-channel MOSFET, switches on, i.e. conducts, when the voltage at the third node 118, which is equal to the voltage across the third capacitor 112, is above the threshold voltage of the third transistor 111. Each of these threshold voltages will vary with temperature.

The capacitor in each circuit is arranged to be charged or discharged upon a transistor from a preceding charging circuit switching states. To illustrate the action of the oscillator 100, a cycle may be considered to begin with the first charging circuit 101. The first capacitor 107 begins charging upon a current being supplied from the first current source 113. A voltage at the first node 116 (voltage traces 201, 204 in FIG. 2) rises as the first capacitor 107 is charged until the voltage reaches the threshold voltage of the first transistor 106. The first transistor 106 then switches state, i.e. begins to conduct. While the first capacitor 107 is charging, the second capacitor 110 is also charging, as it is supplied by the second current source 114. Once the first transistor 106 switches state and begins to conduct, the second capacitor 110 begins to discharge. Once the voltage across the second capacitor 110 (voltage traces 202, 205 in FIG. 2) falls below a level that is equal to the supply voltage $V_{DD}$ minus the threshold voltage of the second transistor 109, the second transistor 109 switches states, i.e. starts conducting. This then causes the third capacitor 112 to rapidly charge, raising the voltage at the third node 118 (voltage traces 203, 206) above the threshold voltage of the third transistor 111, resulting in the first capacitor 107 discharging and being kept discharged while this voltage is kept high. As a result of the first capacitor 107 being discharged, the first transistor 106 switches off and the second capacitor 110 begins to charge again. Once the voltage across the second capacitor 110 rises above a level equal to the supply voltage minus the threshold voltage of the second transistor 109, the second transistor 109 switches state, i.e. stops conducting, causing charge across the third capacitor 112 to be drawn away to the common connection via the third current source 115. Once the voltage across the third capacitor 112 falls below the threshold voltage of the third transistor 111, the third transistor 111 stops conducting and the cycle begins again with the first capacitor 107 beginning to charge.

The behaviour of the oscillator 100 will change as the temperature changes. As the temperature increases, the threshold voltages of the first and third transistors 106, 111 decreases, thereby decreasing the time taken for the transistors to switch states, tending to increase the frequency of oscillation. The threshold voltage of the second transistor 109, however, also decreases with increasing temperature, which results in the time taken for the second capacitor 110 to charge up until the second transistor switches state to turn off being longer, tending to decrease the frequency of oscillation. The relative weightings of the different charging circuits can therefore be chosen to compensate for temperature, for example by selecting appropriate values for the capacitors 107, 110, 112 and the currents supplied by the current sources 113, 114, 115. Selecting suitable values can thereby maintain the frequency at which the oscillator 100 operates to be within a defined range over a defined temperature range. As can be seen in FIG. 2, the time period for each oscillation is roughly equal at high and low temperatures, indicating that the oscillator is compensated for temperature.

Figure 3:
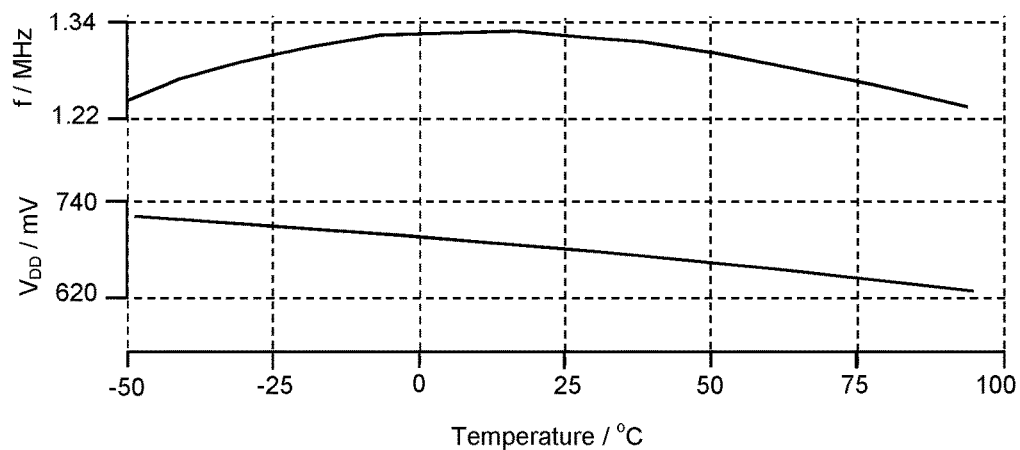
FIG. 3 is a plot of frequency and supply voltage as a function of temperature for an example oscillator embodiment.

FIG. 3 is a plot of frequency and supply voltage as a function of temperature for an example embodiment in which compensation is made to take account of changes in threshold voltage and in the supply voltage $V_{DD}$, which falls with increasing temperature. The oscillation frequency f is maintained within the range of 1.24 to 1.32 MHz over a temperature range of −50 to 100° C., and varies by a smaller amount, within around 1.3 to 1.32 MHz, over an expected operating temperature range of between −25 and 50° C. As can be seen from this plot, the oscillation frequency of the oscillator varies by less than 2% over the temperature range of −25 and 50° C., while the supply voltage over this range is less than 700 mV.

Example current values for the oscillator circuit as described above are 25 nA, 12.5 nA and 50 nA for current sources 113, 114, 115 respectively. Each of the capacitance values will typically be in the fF range, and may be mostly determined by the intrinsic capacitances of the transistors and associated parasitic components due to interconnects. One or more of the capacitors may, however, be determined by incorporating a capacitive element. Capacitor 110, which may have a capacitance of around 2.15 fF in an example embodiment may be determined by a separate capacitive element.

Figure 4:
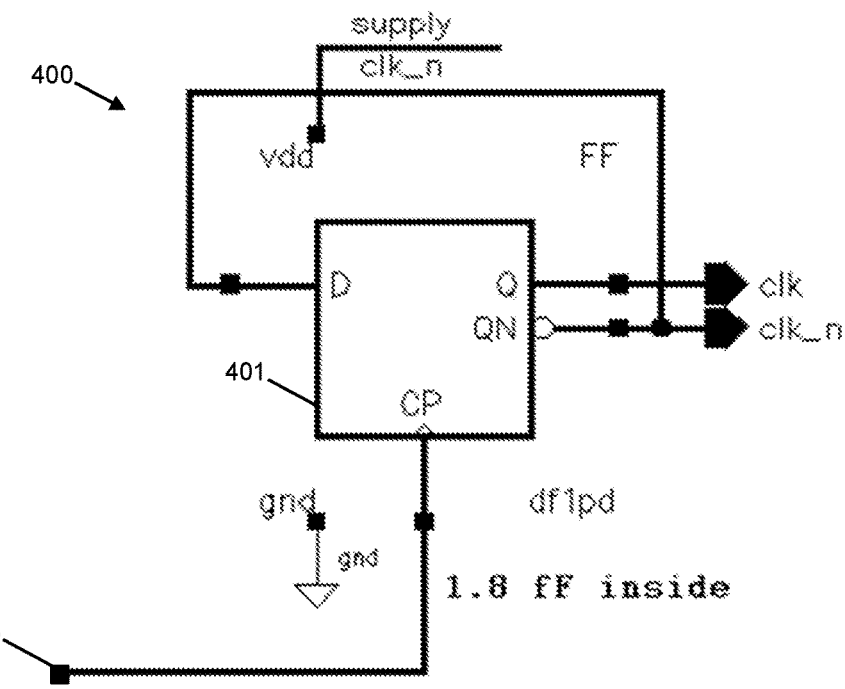
FIG. 4 is a circuit diagram of an output clock module for the example oscillator embodiment.

FIG. 4 is a circuit diagram of an example clock signal output module 400 for connection to the oscillator of FIG. 1. The module 400 connects to node 118, which supplies the signal 203, 206 shown in FIG. 2. This signal is used as a clock pulse input CP to a D-type flip-flop or latch 401, which divides the signal by two to generate a clock signal clk, clk_n having a duty cycle close to 50%.

From reading the present disclosure, other variations and modifications will be apparent to the skilled person. Such variations and modifications may involve equivalent and other features which are already known in the art of high frequency oscillators, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness, it is also stated that the term "comprising" does not exclude other elements or steps, the term "a" or "an" does not exclude a plurality, and reference signs in the claims shall not be construed as limiting the scope of the claims.

The invention claimed is:

1. A temperature-compensated oscillator comprising:
a first capacitive charging circuit connected between a supply voltage connection and a common connection, comprising a first transistor and a first capacitor, the first transistor arranged to switch states when the first capacitor is charged above a threshold voltage of the first transistor;
a second capacitive charging circuit connected between the supply voltage connection and the common connection, comprising a second transistor and a second capacitor arranged to begin discharging when the first transistor switches states, the second transistor arranged to switch states when the second capacitor is discharged below a voltage equal to a supply voltage at the supply voltage connection minus a threshold voltage of the second transistor; and
a third capacitive charging circuit connected between the supply voltage connection and the common connection, comprising a third transistor and a third capacitor arranged to begin discharging when the second transistor switches states, the third transistor arranged to switch states when the third capacitor discharges below a threshold voltage of the third transistor.

2. The temperature-compensated oscillator of claim 1 comprising:

a first current source connected between the supply voltage connection and the first capacitor;
a second current source connected between the supply voltage connection and the second capacitor; and
a third current source connected between the third transistor and the common connection.

3. The temperature-compensated oscillator of claim 1, wherein the first, second and third transistors are field effect transistors.

4. The temperature-compensated oscillator of claim 3 wherein a first node connects the first capacitor with a gate connection of the first transistor and a drain connection of the third transistor, a second node connects a drain connection of the first transistor with the second capacitor and a gate connection of the third transistor and a third node connects the third capacitor with a drain connection of the second transistor and a gate connection of the third transistor.

5. The temperature-compensated oscillator of claim 4 wherein source connections of the first and third transistors are connected to the common connection and the source connection of the second transistor is connected to the supply voltage connection.

6. The temperature-compensated oscillator of claim 5 wherein the first and third transistors are n-channel MOSFETs and the second transistor is a p-channel MOSFET.

7. The temperature-compensated oscillator of claim 4, comprising a clock signal output module having a D-type flip-flop with an input connected to the third node.

8. The temperature-compensated oscillator of claim 1, wherein an oscillation frequency of the oscillator varies by less than 2% over a temperature range of between −25 and 50° C. with a supply voltage of less than 700 mV.

9. An RFID integrated circuit comprising a temperature-controlled oscillator, wherein the temperature-controlled oscillator comprises:
a first capacitive charging circuit connected between a supply voltage connection and a common connection, comprising a first transistor and a first capacitor, the first transistor arranged to switch states when the first capacitor is charged above a threshold voltage of the first transistor;
a second capacitive charging circuit connected between the supply voltage connection and the common connection, comprising a second transistor and a second capacitor arranged to begin discharging when the first transistor switches states, the second transistor arranged to switch states when the second capacitor is discharged below a voltage equal to a supply voltage at the supply voltage connection minus a threshold voltage of the second transistor; and
a third capacitive charging circuit connected between the supply voltage connection and the common connection, comprising a third transistor and a third capacitor arranged to begin discharging when the second transistor switches states, the third transistor arranged to switch states when the third capacitor discharges below a threshold voltage of the third transistor.

10. An RFID tag comprising an integrated circuit, wherein the integrated circuit comprises a temperature-controlled oscillator, wherein the temperature-controlled oscillator comprises:
a first capacitive charging circuit connected between a supply voltage connection and a common connection, comprising a first transistor and a first capacitor, the first transistor arranged to switch states when the first capacitor is charged above a threshold voltage of the first transistor;

a second capacitive charging circuit connected between the supply voltage connection and the common connection, comprising a second transistor and a second capacitor arranged to begin discharging when the first transistor switches states, the second transistor arranged to switch states when the second capacitor is discharged below a voltage equal to a supply voltage at the supply voltage connection minus a threshold voltage of the second transistor; and a third capacitive charging circuit connected between the supply voltage connection and the common connection, comprising a third transistor and a third capacitor arranged to begin discharging when the second transistor switches states, the third transistor arranged to switch states when the third capacitor discharges below a threshold voltage of the third transistor.

\* \* \* \* \*